United States Patent [19]

Shima et al.

[11] Patent Number: 5,033,615

[45] Date of Patent: Jul. 23, 1991

[54] WRAPPED GLASS CAP ARTICLE

[75] Inventors: Takeshi Shima; Atsushi Koshimura; Yukinori Sakumoto; Fuminori Aikawa, all of Shizuoka, Japan

[73] Assignee: Tomoegawa Paper Co., Ltd., Tokyo, Japan

[21] Appl. No.: 311,158

[22] Filed: Feb. 15, 1989

[30] Foreign Application Priority Data

Feb. 15, 1988 [JP] Japan .................................. 63-32060

[51] Int. Cl.$^5$ ............................................. B65D 75/24
[52] U.S. Cl. ...................................... 206/328; 428/76
[58] Field of Search .................. 428/76; 206/328, 330, 206/332, 384

[56] References Cited

U.S. PATENT DOCUMENTS

| 3,385,426 | 5/1968 | May et al. ............................ 206/330 |
| 3,443,683 | 5/1969 | Felty, Jr. et al. ..................... 206/330 |
| 3,517,438 | 6/1970 | Johnson et al. ...................... 206/330 |
| 4,037,716 | 7/1977 | Marks .................................. 206/484 |
| 4,279,344 | 7/1981 | Holloway, Jr. ....................... 206/484 |
| 4,633,370 | 12/1986 | Hamuro et al. ..................... 206/330 |
| 4,781,953 | 11/1988 | Ball et al. ............................ 206/328 |

Primary Examiner—Joseph Man-Fu Moy
Attorney, Agent, or Firm—Darby & Darby

[57] ABSTRACT

Disclosed is wrapped glass cap article, comprising at least one glass cap and a pair of plastic films having located therein the at least one glass cap, at least one of the pair of plastic films being imparted on its inner surface with a weak adhesiveness so that the glass cap is tightly sealed due to the weak adhesiveness of the plastic film. The article gives rise to glass caps with less contamination when the plastic film is peeled off.

22 Claims, 3 Drawing Sheets

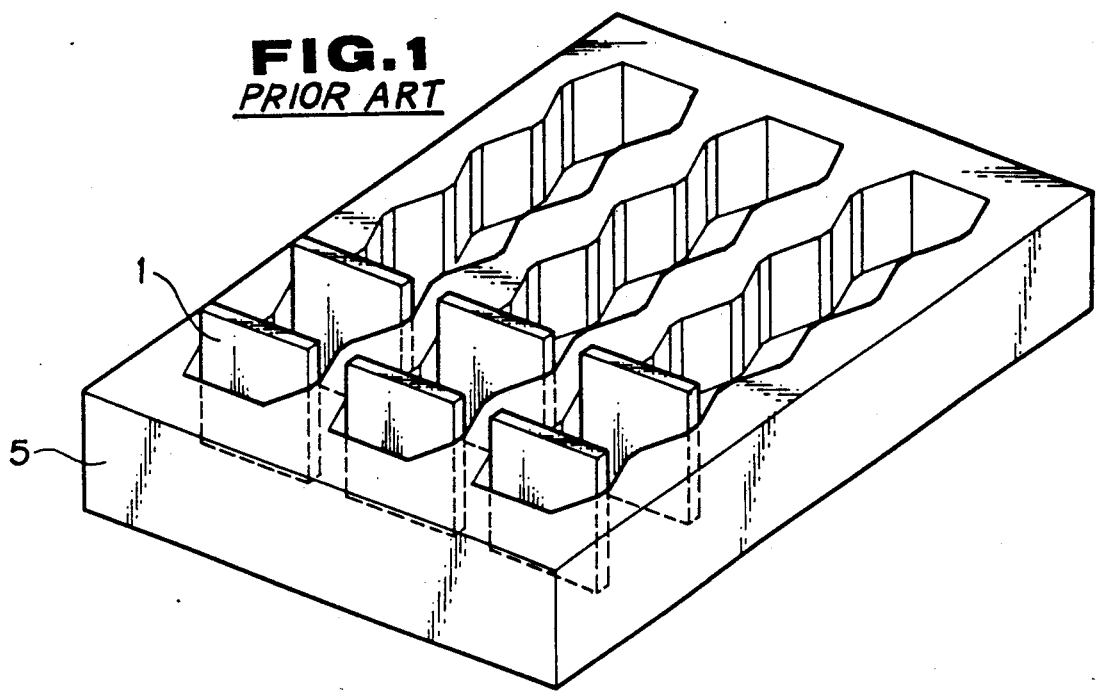
FIG.1 *PRIOR ART*
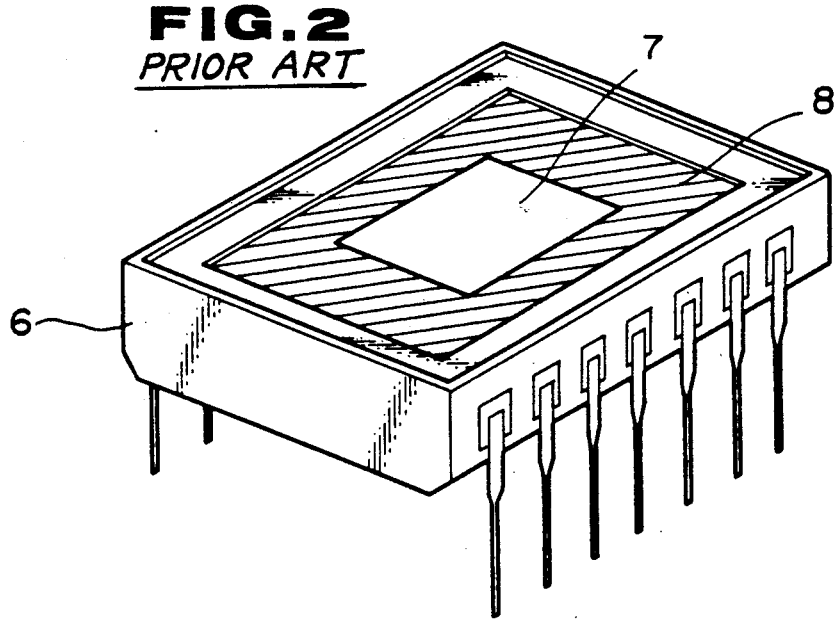
FIG.2 *PRIOR ART*

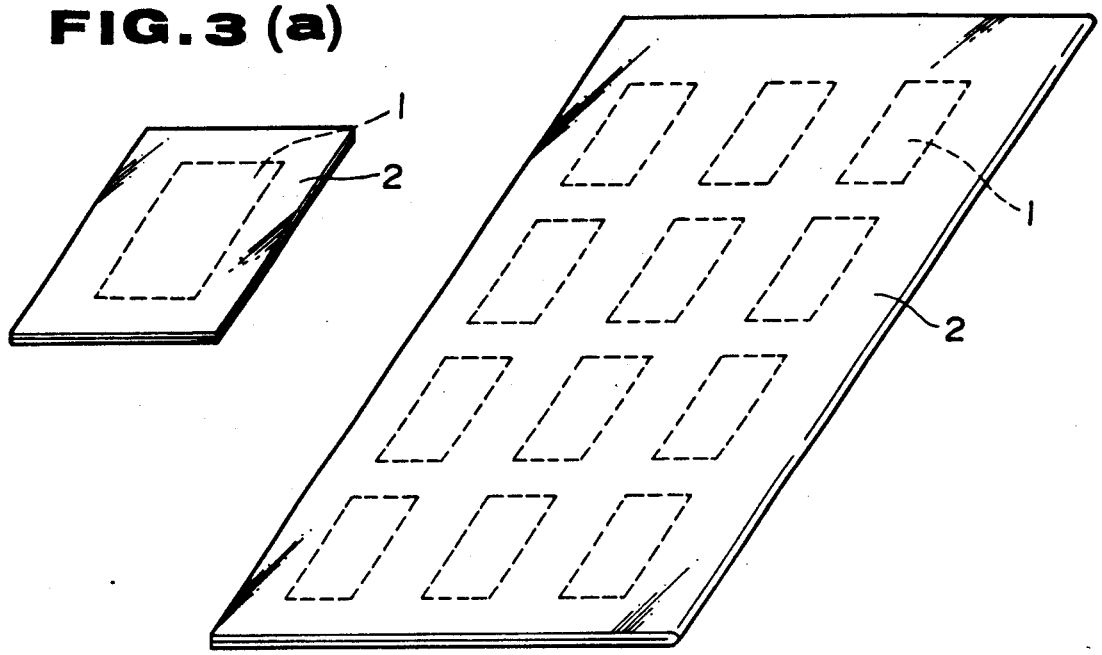
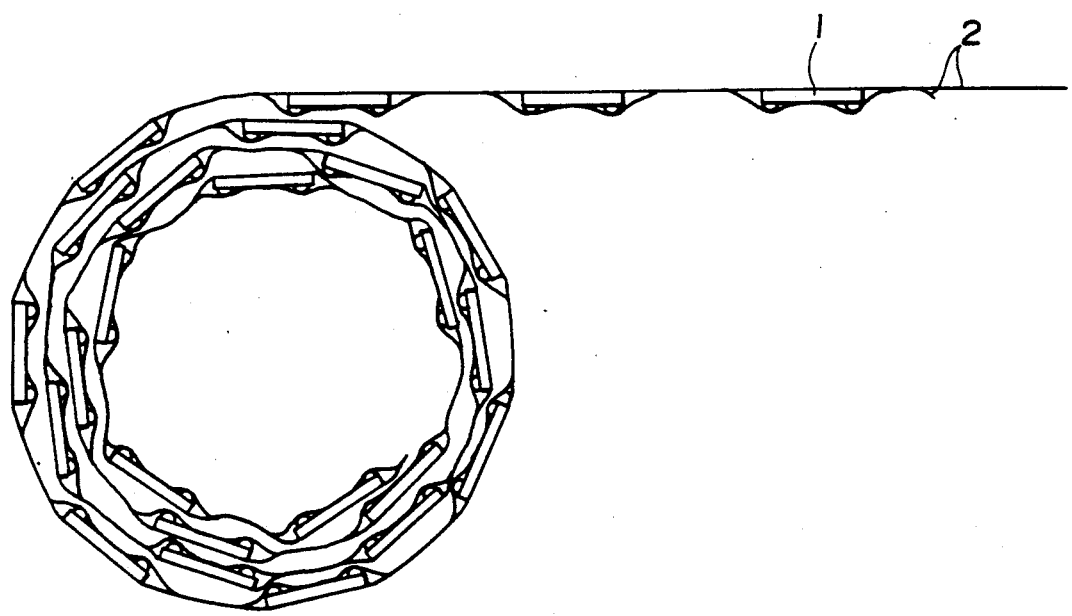

WRAPPED GLASS CAP ARTICLE

BACKGROUND OF THE INVENTION

1. Field of the Invention

This invention relates to a package for glass caps for sealing, for example, solid-state image sensing devices, IC chips or a like device or element to which dust could quite often cause serious damages or deteriorate its function.

2. Description of the Prior Art

Recently, research and development of solid-state image sensing device for use in video cameras have been made widely.

Solid image pickup apparatus generally has a solid-state image sensing element such as CCD (charge coupled device) or MOS (metal oxide semiconductor) fixedly housed in a ceramics package or a like and the package is sealed with a glass cap coated with an organic or inorganic adhesive. Sealing of solid-state image sensing device or a like with a glass cap is performed as follows. That is, one of the glass caps 1 stored in a storage casing 5 for storing glass caps as shown in FIG. 1, which casing is usually made of a resin such as polyvinyl chloride or polypropylene, is picked up with a forceps or pincette or a like holding means, and is placed on the upper frame of a ceramics package 6 and above a solid-state image sensing element 7, which is partly covered with a light shielding plate, in such a manner that the opening of the ceramics package as shown FIG. 2 can be closed therewith. Alternatively, the glass cap is placed on the upper frame of the ceramics package after it is coated with an adhesive, followed by heating the coated glass cap as is without pressurization or under pressure with a clip, for example, to melt the adhesive, thereby bonding the glass cap to the package.

In the process of manufacturing such image pickup apparatus, contamination of glass caps could occur frequently. The glass caps are contaminated with dust or a like undesirable matter not only in the process of manufacture but also during the period from their manufacture to the sealing of the solid-state image sensing element.

In the conventional storage casing as shown in FIG. 1 at present widely employed, minute particles of undesired matters such as glass powder and adhesive powder, minute fragments of the casing itself are formed, or foreign matters which stick to the casing are scattered, by the vibration of the casing or shocks given to the casing when the casing storing the glass caps is transported and they tend to adhere to the glass caps. Obviously, the function of the solid-state image sensing device is seriously deteriorated when it is manufactured using such contaminated glass caps.

It is therefore necessary to remove various undesirable or foreign matters, and also the glass caps should be handled with care in order to prevent the formation of foreign matters. This reduces the efficiency of operation and makes it difficult to automate the process of the solid-state image sensing device.

SUMMARY OF THE INVENTION

It is a primary object of the present invention to provide a wrapped glass cap which can be housed, transported or stored without contaminating a transparent glass.

As a result of intensive research with view to obviating the above-described defects of the conventional technique, the present invention has been accomplished, which provides a wrapped glass cap article, comprising at least one glass cap and a pair of sheets of a plastic film having located therein the at least one glass cap, at least one of the pair of sheets of the plastic film being imparted on its inner surface within a weak adhesiveness so that the glass cap is tightly sealed due to the adhesiveness of the plastic film.

The present invention is applicable not only to glass caps for ceramics packages for solid-state image sensing elements such as CCD and MOS but also to packages for semiconductors provided with a glass member adhered thereto such as packages for EPROM.

BRIEF DESCRIPTION OF THE DRAWINGS

FIG. 1 is a perspective view of a conventional storage casing for storing glass caps for use in solid-state image sensing device;

FIG. 2 is a perspective view of a conventional package for use in a solid-state image sensing device;

FIG. 3a and FIG. 3b are each a perspective view of an example of a wrapped glass cap article according to the present invention;

FIG. 3c is a cross-sectional view of an example of a wrapped glass cap according to the present invention;

DETAILED DESCRIPTION OF THE INVENTION

Figure 4:
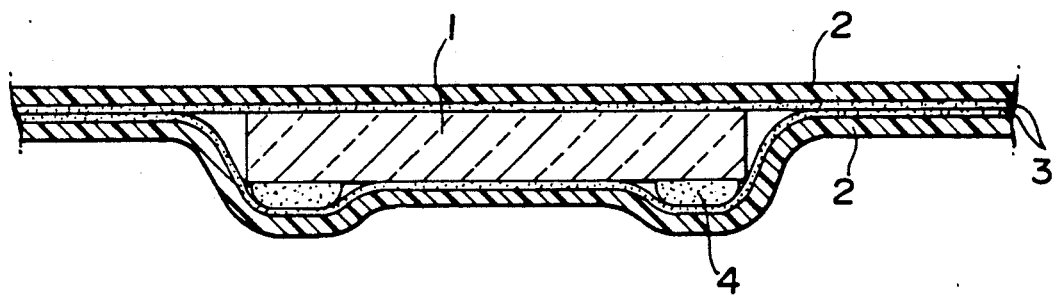
FIG. 4 is an enlarged cross-sectional view of a major part of a wrapped glass cap according to the present invention.

An example of the wrapped glass cap article of the present invention will be described referring to the drawings, in which FIG. 3a illustrates a wrapped glass cap article which includes only one glass cap 1 for sealing located between two sheets of a plastics film 2. The glass cap may be of any type of transparent glass or silica. Usually, glass caps are of 5 to 14 mm in width and 15 to 40 mm in length although their size is not limited thereto and may vary depending to the purpose for which they are used. When a single glass cap is wrapped, the size of the plastic film sheets may usually be 15 to 35 mm in width and 25 to 60 mm in length. It is preferred that the margins between the periphery of the plastic film sheet 2 and the edge of the glass cap 1 be about 5 to 10 mm.

FIG. 3b shows a sheet-like wrapped glass cap article which includes a plurality of glass caps for sealing located between two sheets of the plastic film 2 to form a laminate in which the glass caps 1 are arranged separate from each other in a plurality rows with the periphery of the sheets being sealed. In order to obtain this construction, two plastic film sheets may be used to sandwich the glass caps 1 or a single sheet of the plastic film 2 may be folded and the glass caps may be located between the folded parts of the plastic film 2. When two plastics film sheets are used, the plastics material for the film sheets may be the same or different. The number of the glass caps 1 located may range from about 4 to about 25. The size of the plastic film sheet 2 may usually be 35 to 135 mm in width and 45 to 260 mm in length. The margin between the periphery of the plastic film 2 and the edge of the glass cap and the distance between the edges of two adjacent glass caps 1 each may usually be about 5 to 10 mm.

FIG. 3c illustrates a roll type wrapped glass cap article which can be taken up by winding. The wrapped glass cap article includes a plurality of glass caps for sealing 1 and two sheets of tape-like plastics film 2. The glass caps 1 are sandwiched by the plastics film sheets 2 and arranged along the length of the plastics film sheet in a single row or in a plurality of rows and at a constant distance one after another. The portions of the plastics film sheets surrounding the respective glass caps are sealed. Usually, the tape-like wrapped glass cap article is several meters to about 10 meters and contains about 20 glass caps per meter.

As shown in FIG. 4, which is a partial enlarged cross-sectional view of the roll type wrapped glass cap article, the glass cap 1 is placed between a pair of plastic film sheets 2, and both of the plastic film sheets 2 are coated with an adhesive 3 on the inner surfaces thereof to seal the glass cap 1. The adhesive 3 may be provided on only one of the inner surfaces. Use of the adhesive 3 can be avoided when the plastic film used has self-adhesiveness.

If the glass cap 1 is coated with a sealing adhesive 4, it can be attached to the package without coating a sealing adhesive on the portion of the package to which the glass cap is to be fitted. Conversely, the portion of the package to which the glass cap 1 is to be fitted should be coated with a sealing adhesive when the glass cap 1 does not have the sealing adhesive.

Figure 5:
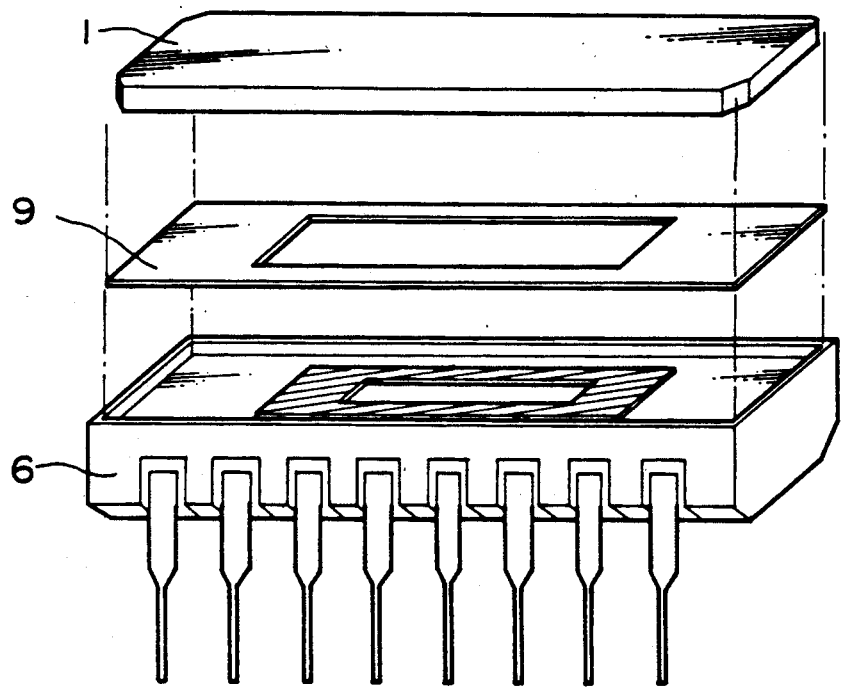
FIG. 5 is an exploded perspective view for illustrating the procedure of fitting a glass cap according to the present invention to a package.

The sealing adhesive may be of amorphous or solid type. The amorphous one includes paint or liquid type adhesives and the solid one may be in the form of a framework as shown in FIG. 5.

When in use, the plastic film is broken or adhesion of two sheets or folded parts of the plastic film are unsealed and the glass cap 1 is picked up with a vacuum forceps, for example, and placed on a ceramic package 6 through the frame-like adhesive 9 so that a solid-state image sensing element and a light shield plate can see through the window or opening defined by the framework. When the glass cap 1 is used which has been coated with the sealing adhesive such as epoxy based thermosetting adhesive as shown in FIG. 4, the adhesive is heated, for example, at 150° for 1 to 2 hours. Heating of the adhesive is unnecessary when it is discharged from a dispenser onto peripheral portion of a glass cap or attachment part of the package immediately before the glass cap is fitted to the package. The sealing adhesive may be pressure-sensitive and the glass cap 1 is firmly fitted to the ceramics package by pressurization.

The plastic film used as a wrapping material may be polyethylenes, polypropylenes, polystyrenes, polyvinyl acetates, ethylene-ethyl acrylate copolymers, polyesters and the like.

The adhesive may be coated on the plastic film as stated above in a thickness of not larger than 50 micrometers.

Instead of using an adhesive, sealing may be achieved by using a wrapping material which has a weal adhesiveness. Suitable examples of the weakly viscous plastic films include ethylene-vinyl acetate copolymers and ethylene-ethyl acrylate copolymers. The extent of the weak adhesiveness may suitably be such that the peel strength of the plastic film from the glass cap is not higher than 500 g/10 mm at 180° C. Preferably, the self-adhesive plastic film is made of ethylene-vinyl acetate copolymer (ethylene/vinyl acetate ratio=98/2 to 70/30 by mole). When the content of vinyl acetate monomer is less than 2% by mole, the adhesiveness of the wrapping material is unsatisfactory and on the other hand, the adhesiveness of the plastic film is too high to peel off glass caps therefrom when the content of the vinyl acetate monomer is more than 30% by mole.

s for the adhesive, there can be enumerated those materials which are not transferred to the glass when the plastic film is peeled off from the wrapped article of the present invention. Examples of such material include acrylates, vinyl acetate based resins such as ethylene-vinyl acetate copolymers, acrylate resins such as ethylene-ethyl acrylate copolymers, rubbers such as natural rubber and styrene-butadiene rubber, and silicones such as linear organopolysiloxane. Of these, ethylene-vinyl acetate copolymers and linear organopolysiloxane are preferred.

EXAMPLE 1

One surface of a 25 micrometer-thick polyethylene terephthalate film was coated with an acrylate based adhesive in a thickness of 10 micrometer and dried to form a polyethylene terephthalate film having a weak adhesiveness on one surface thereof. The peel strength of the film to glass was 10 g/10 mm width at 180° (JIS Z0237).

Twenty (20) glass caps for solid-state image sensing elements which cap had been washed and dried were located between two sheets of polyethylene film which were imparted weak adhesiveness only on one surface thereof, the glass caps being arranged in a row one after another along the length of the film sheet as shown in FIG. 3c. The obtained article was lightly pressed with a resilient roll or a like means to tightly seal the plastic film to produce a wrapped article of the present invention.

EXAMPLE 2

One surface of a 25 micrometer-thick polyethylene terephthalate film was coated with an acrylate based adhesive in a thickness of 20 micrometer and dried to form a polyethylene terephthalate film having a weak adhesiveness on one surface thereof. The peel strength of the film to glass was 15 g/10 mm width at 180° (JIS Z023701).

Twenty (20) glass caps for solid-state image sensing elements which cap had been washed and dried were located between the single-surface-coated polyethylene terephthalate film and a sheet of a 25 micrometer-thick, non-coated polyethylene terephthalate film in such a manner that the adhesive was placed inside, the glass caps being arranged in a row one after another along the length of the film sheet as shown in FIG. 3c. The obtained article was lightly pressed with a resilient roll or a like means to tightly seal the plastic film to produce a wrapped article of the present invention.

EXAMPLE 3

A 200 micrometer-thick ethylene-vinyl acetate copolymer film having self-adhesiveness ("PAC-3", trade name for a product by Sanei Kagaku Kogyo Co., Ltd.) was provided. The film had a peel strength to glass of 5 g/10 mm width at 180° (JIS Z0237).

Twenty (20) glass caps for solid-state image sensing elements which caps had been washed and dried were located between two sheets of the film in the same manner as in Example 1, and the film sheets were sealed over whole the surface to obtain a wrapped article of the present invention.

COMPARATIVE EXAMPLE

In a conventional casing for transportation as shown in FIG. 1 were stored twenty glass caps for solid-state image sensing elements after washing and drying, and a lid was put on the casing to shut it up. The casing with the glass caps was used as comparative sample.

The samples obtained according to Examples 1 to 3 and comparative sample were subjected to transportation test as follows.

Firstly, the samples and comparative sample, after they were packed in respective polyethylene bags under vacuum, were fixed in a shaker (Taiyo Kagaku Kogyo Co., Ltd., R-1 type) and shaken at a 60 times/minute and at a shaking width of 30 mm for 6 hours. Thereafter, the samples and the comparative sample were taken out of the shaker. The glass caps of the samples and of the comparative sample were taken out from the plastic films or the casing, and the size and number of foreign matters attached to the glass caps were determined using an object microscope and mean values were calculated for 20 glass caps.

The results obtained are shown in Table below.

TABLE

| | Mean Number of Foreign Matters per Glass Cap | | | |
|---|---|---|---|---|
| | 1–10 μm | 11–20 μm | 21 μm or more | Sum |
| Example 1 | 0.2 | 0 | 0 | 0.2 |
| Example 2 | 0.15 | 0 | 0 | 0.15 |
| Example 3 | 0.2 | 0.15 | 0 | 0.35 |
| Comparative Example 1 | 1.95 | 1.1 | 0.8 | 3.85 |

From the results shown in TABLE above, it can be seen that the wrapped glass cap article of the present invention gave rise to glass caps with much reduced amount of foreign matters as compared with the glass caps stored in the conventional casing.

What is claimed is:

1. A wrapped glass cap article, comprising:
at least one glass cap; and
a pair of plastic film portions, at least one of said plastic film portions having an inner surface with an adhesive strength which bonds peripheral portions of said plastic film portions to each other to define a space for accommodating said glass cap between said plastic film portions, said glass cap being sealed in said space between said plastic film portions by said peripheral portions of said plastic film portions being bonded to each other so as to avoid contamination from outside said plastic film portions, said adhesive strength being such that said plastic film portions may be stripped off from said glass cap at a peeling strength of at most 500 g/10 mm at 180° C.

2. A wrapped glass cap article as claimed in claim 1, wherein said one of said pair of plastic film portions includes a coating composed of a pressure sensitive adhesive which seals said glass cap in said space by providing said adhesive strength for bonding together said peripheral portions of said plastic film portions.

3. A wrapped glass cap article as claimed in claim 2, wherein said adhesive is an organic adhesive.

4. A wrapped glass cap article as claimed in claim 3, wherein said organic adhesive is selected from the group consisting of acrylate resins, vinyl acetate resins, natural rubber, synthetic rubbers, and silicone resins.

5. A wrapped glass cap article as claimed in claim 1, wherein said plastic film portions are composed of a plastics selected from the group consisting of polyethylene, polypropylene, polystyrene, polyvinyl acetate, ethylene-ethyl acrylate copolymer, and polyester.

6. A wrapped glass cap article as claimed in claim 1, wherein said plastic film portions are composed of a plastics selected from the group consisting of ethylene-vinyl acetate copolymer and ethylene-ethyl acrylate copolymer.

7. A wrapped glass cap article as claimed in claim 1, wherein said glass cap is coated with a sealing adhesive and adapted to be bonded to an object to which said at least one glass cap is intended to be fitted.

8. A wrapped glass cap article as claimed in claim 7, wherein said sealing adhesive is a frame-form adhesive.

9. A wrapped glass cap article as claimed in claim 1, wherein said wrapped glass cap article includes a single glass cap.

10. A wrapped glass cap article as claimed in claim 1, wherein said wrapped glass cap article includes a plurality of glass caps.

11. A wrapped glass cap article as claimed in claim 1, wherein said one of said pair of plastic film portions has a coating composed of a pressure sensitive adhesive which seals said glass cap in said space by providing said adhesive strength for bonding together said peripheral portions of said plastic film portions.

12. A wrapped glass cap article as claimed in claim 11, wherein said organic adhesive is selected from the group consisting of acrylate resins, vinyl acetate resins, natural rubber, synthetic rubbers, and silicone resins.

13. A wrapped glass cap article as claimed in claim 12, wherein said plastic film portions are composed of plastics selected from the group consisting of polyethylene, polypropylene, polystyrene, polyvinyl acetate, ethylene-ethyl acrylate copolymer, and polyester.

14. A wrapped glass cap article as claimed in claim 1, wherein said plastic film portions are composed of plastics selected from the group consisting of polyethylene, polypropylene, polystyrene, polyvinyl acetate, ethylene-ethyl acrylate copolymer, and polyester.

15. A wrapped glass cap article as claimed in claim 14, wherein said plastic film portions are composed of plastics selected from the group consisting of ethylene-vinyl acetate copolymer and ethylene-ethyl acrylate copolymer.

16. A wrapped glass cap article as claimed in claim 1, wherein said glass cap is coated with a sealing adhesive and adapted to be bonded to an object to which said at least one glass cap is intended to be fitted.

17. A wrapped glass cap article as claimed in claim 14, wherein said sealing adhesive is a frame-form adhesive.

18. A wrapped glass cap article as claimed in claim 7, wherein said at least one of said pair of plastic film portions has a coating composed of a pressure sensitive adhesive which seals said glass cap in said space by providing said adhesive strength for bonding together said peripheral portions of said plastic film portions.

19. A wrapped glass cap article s claimed in claim 16, wherein said adhesive is an organic adhesive.

20. A wrapped glass cap article as claimed in claim 17, wherein said organic adhesive is selected from the group consisting of acrylate resins, vinyl acetate resins, natural rubber, synthetic rubbers, and silicone resins.

21. A wrapped glass cap article as claimed in claim 7, wherein said plastic film portions are composed of plastics selected from the group consisting of polyethylene, polypropylene, polystyrene, polyvinyl acetate, ethylene-ethyl acrylate copolymer and polyester.

22. A wrapped glass cap article as claimed in claim 19, wherein said plastic film portions are composed of a plastics selected from the group consisting of ethylene-vinyl acetate copolymer and ethylene-ethyl acrylate copolymer.

* * * * *